United States Patent
Xia et al.

(10) Patent No.: US 8,431,474 B2
(45) Date of Patent: Apr. 30, 2013

(54) THREE DIMENSIONAL MULTILAYER CIRCUIT

(75) Inventors: Qiangfei Xia, Palo Alto, CA (US); Wei Wu, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 887 days.

(21) Appl. No.: 12/567,537

(22) Filed: Sep. 25, 2009

(65) Prior Publication Data

US 2011/0076810 A1  Mar. 31, 2011

(51) Int. Cl.
*H01L 21/44* (2006.01)

(52) U.S. Cl.
USPC ........... 438/598; 438/597; 438/618; 438/622; 438/666; 438/667; 438/671; 438/674; 438/675; 257/774; 257/779

(58) Field of Classification Search .................. 257/774, 257/779; 438/597, 598, 618, 622, 666, 667, 438/671, 674, 675
See application file for complete search history.

(56) References Cited

U.S. PATENT DOCUMENTS

| | | | |
|---|---|---|---|
| 6,965,137 B2 * | 11/2005 | Kinney et al. ................. | 257/295 |
| 7,073,157 B2 | 7/2006 | DeHon et al. | |
| 7,112,815 B2 * | 9/2006 | Prall ................................. | 257/2 |
| 7,202,566 B2 * | 4/2007 | Liaw .............................. | 257/758 |
| 7,692,309 B2 * | 4/2010 | Cox ............................... | 257/776 |
| 2005/0055387 A1 | 3/2005 | Kuekes et al. | |
| 2006/0214683 A1 | 9/2006 | DeHon | |
| 2008/0193359 A1 * | 8/2008 | Yu et al. ......................... | 423/344 |
| 2010/0159688 A1 * | 6/2010 | Rinerson et al. .............. | 438/598 |
| 2010/0162067 A1 * | 6/2010 | Norman ......................... | 714/746 |

OTHER PUBLICATIONS

Snider, Gregory S. et al.; "Nano/CMOS architectures using a field-programmable nanowire interconnect"; Nanotechnology; 2007; vol. 18; Institute of Physics Publishing.
Strukov, Dmitri B. et al.; "Reconfigurable Hybrid CMOS/Nanodevice Circuits for Image Processing"; 2007; IEEE.

* cited by examiner

*Primary Examiner* — Bac Au

(57) ABSTRACT

A method for forming three-dimensional multilayer circuit includes forming an area distributed CMOS layer configured to selectively address a set of first vias and a set of second vias. A template is then aligned with the first set of vias and lower crossbar segments are created using the template. The template is then removed, rotated, and aligned with the set of second vias. Upper crossbar segments which attach to the second set of vias are then created.

20 Claims, 9 Drawing Sheets

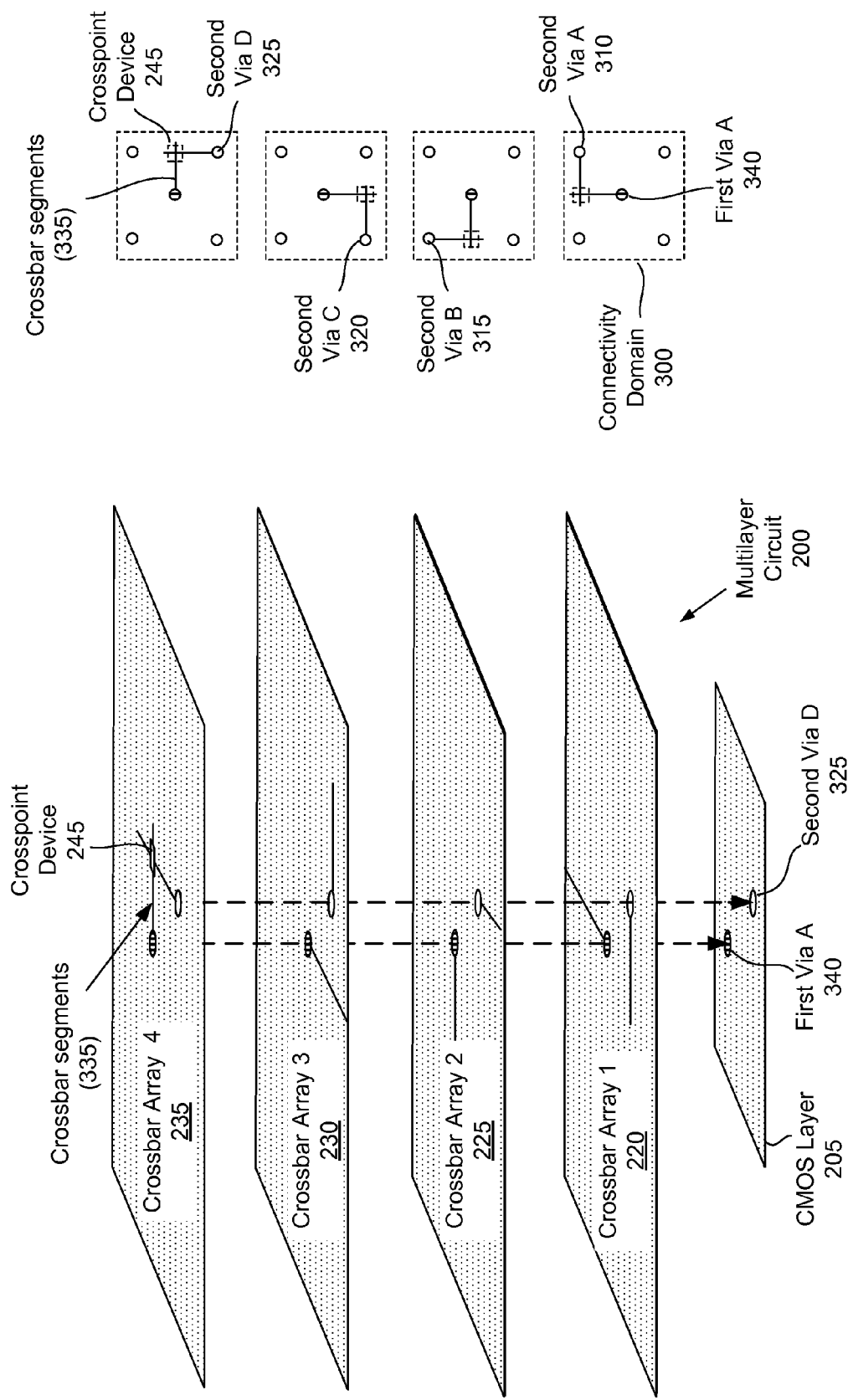

THREE DIMENSIONAL MULTILAYER CIRCUIT

BACKGROUND

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIGS. 3A and 3B are diagrams of an illustrative integrated circuit with four crossbar arrays, according to one illustrative embodiment of principles described herein.

Throughout the drawings, identical reference numbers designate similar, but not necessarily identical, elements.

DETAILED DESCRIPTION

In the past decades, the semiconductor industry has been improving the performance and density of integrated circuits primarily by shrinking the size of the electronic elements within the circuits. However, a number of barriers are becoming evident which increase the difficulty of making further reduction to the size of these elements. One potential solution for increasing the performance and planar density of integrated circuits is to create three dimensional circuits which contain multiple layers of interconnected circuitry.

The three dimensional multilayer circuit described below is a hybrid of CMOS circuitry and crossbar arrays which provides higher density in digital memories, which dramatically improves the density of field programmable logic. According to one illustrative embodiment, a number of crossbar arrays are stacked vertically above an area distributed CMOS circuit. Connections are made between the various arrays and the CMOS circuit with vias. By changing the direction of the crossbars attached to the vias in each layer, each programmable crosspoint device in the multilayer circuit can be uniquely addressed. Various three dimensional circuits which include integrated crossbar arrays are described in PCT Application No. PCT/US2009/039666, to Dmitri Strukov et al., entitled "Three Dimensional Multilayer Circuit," filed Apr. 6, 2009, which is incorporated by reference in its entirety.

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment, but not necessarily in other embodiments. The various instances of the phrase "in one embodiment" or similar phrases in various places in the specification are not necessarily all referring to the same embodiment.

Figure 1:
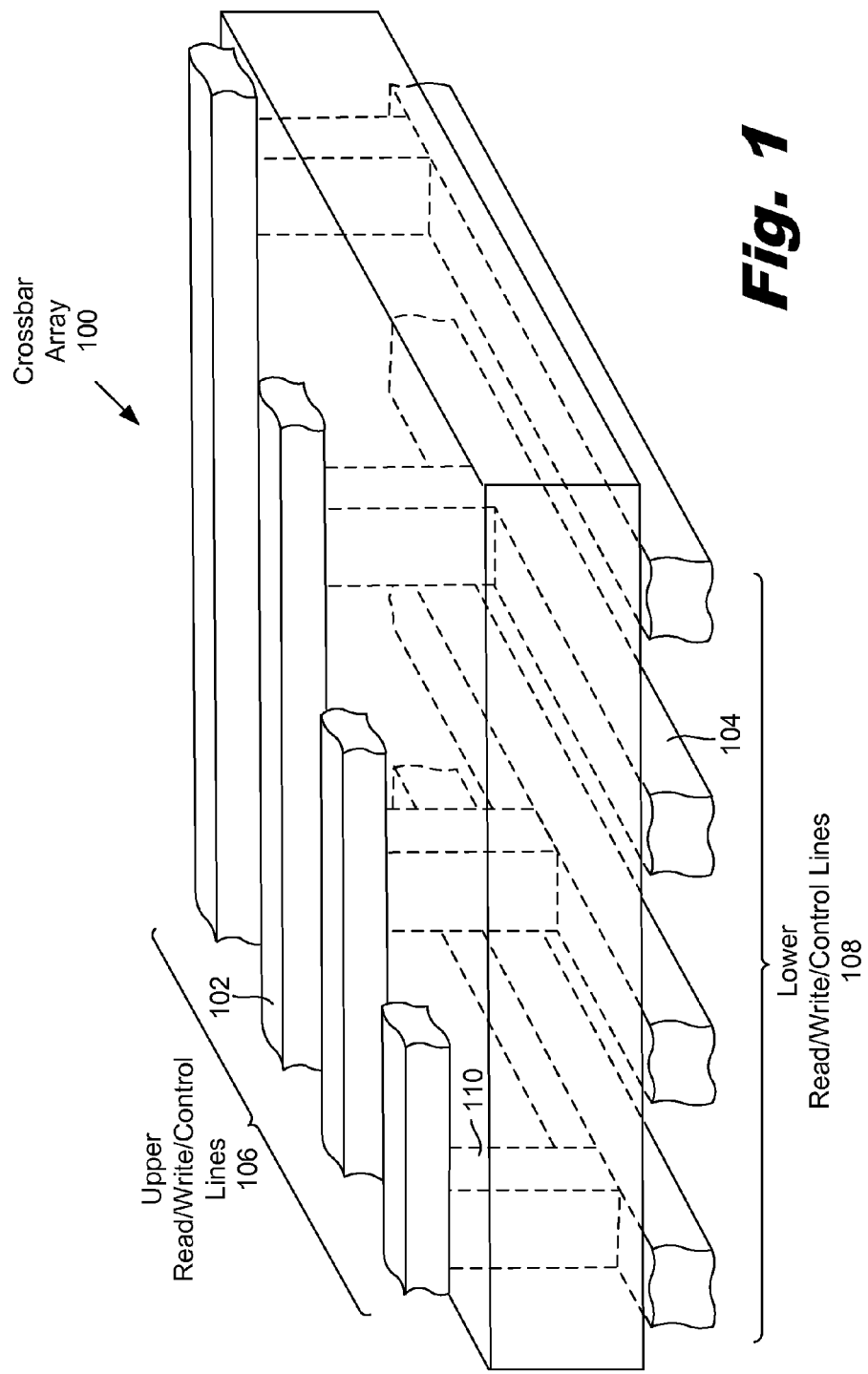
FIG. 1 is a perspective view of a crossbar array, according to one embodiment of principles described herein.

FIG. 1 shows an isometric view of an illustrative crossbar array (100). The crossbar array (100) is composed of a lower layer of approximately parallel nanowires (108) that are overlain by an upper layer of approximately parallel nanowires (106). The nanowires of the upper layer (106) are roughly perpendicular, in orientation, to the nanowires of the lower layer (108), although the orientation angle between the layers may vary. For example, a crossbar architecture may be formed when the nanowire of the upper layer (106) cross the nanowires of the lower layer (108) at a non-zero angle.

The two layers of nanowires form a lattice, or crossbar, in which each nanowire of the upper layer (106) overlies all of the nanowires of the lower layer (108). According to one illustrative embodiment, the programmable crosspoint devices (110) are formed between the crossing nanowires at these intersections. Consequently, each nanowire (102) in the upper layer (106) is connected to every nanowire (104) in the lower layer (108) through a programmable crosspoint device and visa versa.

These programmable crosspoint devices (110) may perform a variety of functions including providing programmable switching between the nanowires (102, 104). Because every nanowire (104) in the first layer of nanowires (108) intersects each nanowire (102) in the second layer of nanowires (106), placing a programmable crosspoint device at each intersection (110) allows for any nanowire in the lower layer (108) to be connected to any nanowire in the upper layer (106).

Although individual nanowires (102, 104) in FIG. 1 are shown with rectangular cross sections, nanowires can also have square, circular, elliptical, or more complex cross sections. The nanowires may also have many different widths or diameters and aspect ratios or eccentricities. The term "nanowire crossbar" may refer to crossbars having one or more layers of sub-microscale wires, microscale wires, or wires with larger dimensions, in addition to nanowires.

The programmable crosspoint devices (110) may operate using a variety of technologies, including memristive and memcapacitive technology. According to one illustrative embodiment, the programmable crosspoint devices (110) may be memristors. As described in U.S. Patent App. Pub. No. 20080079029, entitled "Multi-terminal Electrically Actuated Switch" to R. Stanley Williams, which is hereby incorporated in its entirety, memristor devices are based on dopant motion within a matrix material. According to one illustrative embodiment, the memristor may use a silicon-based matrix as described in International App. No. PCT/US09/31140, entitled "Silicon-based Memristive Device" to Matthew Picket et al., which is hereby incorporated in its entirety.

Each of the memristors may be used to represent one or more bits of data. For example, in the simplest case, memristors may have two states: a conductive (low resistance) state and a nonconductive (high resistance) state. The conductive state may represent a binary "1" and the nonconductive state may represent a binary "0", or visa versa. Binary data can be written into the crossbar architecture (100) by changing the conductive state of the memristive crosspoint devices (110). The binary data can then be retrieved by sensing the state of the memristive crosspoint devices (110).

Another example of a programmable crosspoint device (110) is a memcapacitor. A memcapacitor uses mobile ions in a memcapacitive matrix to generate a hysteretic capacitance behavior. In one embodiment, the memcapacitor can be programmed into a high capacitance or low capacitance state by applying an appropriate programming voltage. This high capacitive or low capacitive state is stable until another programming voltage is applied. Various illustrative embodiments of memcapacitors are further described in International App. No. PCT/US09/46691, entitled "Memcapacitor" to Alexandre Bratkovski et al., which is hereby incorporated in its entirety.

The above examples are only illustrative embodiments of a crossbar array (100). A variety of other configurations could be used. For example, the crossbar array (100) can incorporate programmable crosspoint devices (110) which have more than two states. In another example, crossbar architecture can be used to form implication logic structures and crossbar based adaptive circuits such as artificial neural networks.

According to one illustrative embodiment, a crossbar memory array or other memristive device is integrated into complimentary metal-oxide-semiconductor (CMOS) or other conventional computer circuitry. This CMOS circuitry can provide additional functionality to the memristive device such as input/output functions, buffering, logic, or other functionality.

Figure 2:
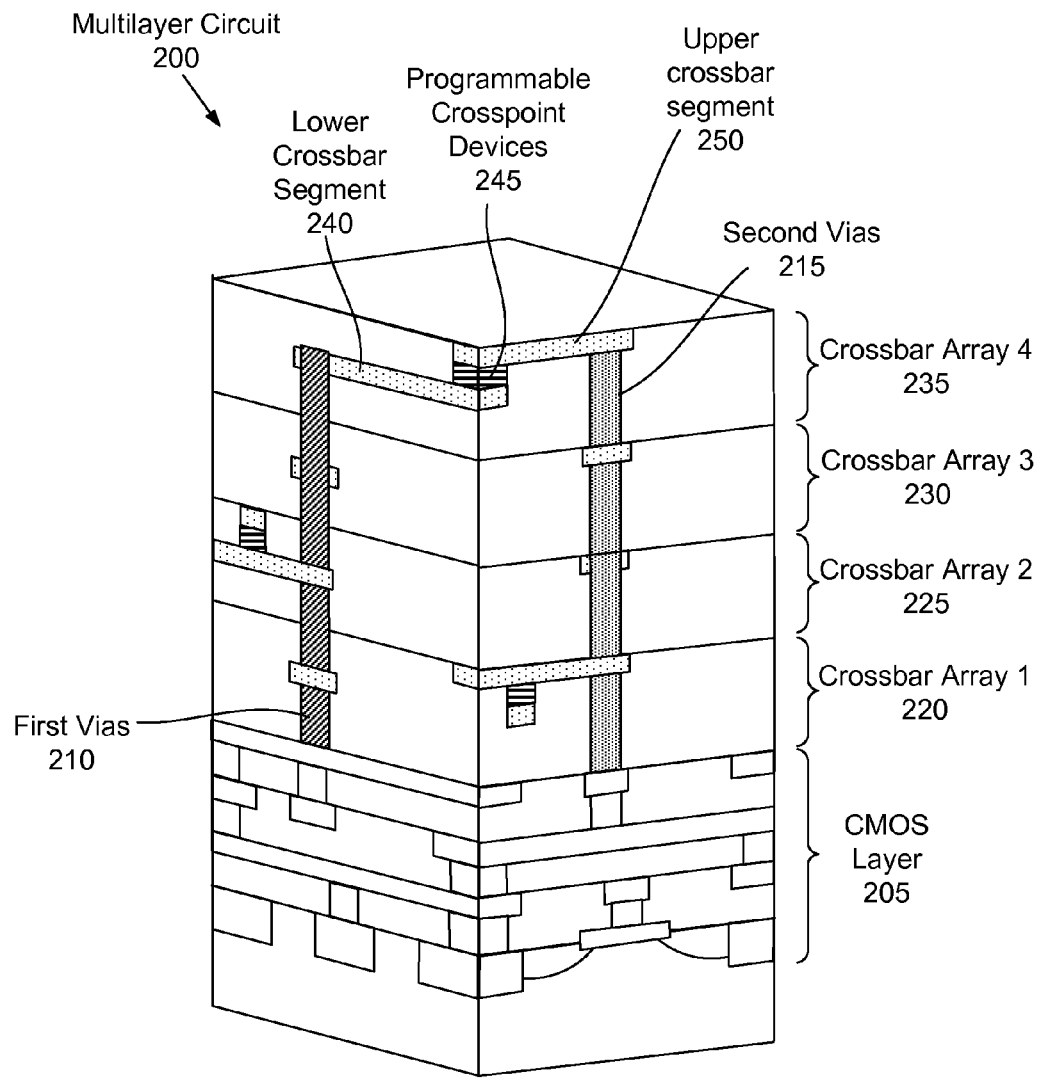
FIG. 2 is cross-sectional diagram of an illustrative multilayer circuit which includes a CMOS layer and multiple crossbar arrays, according to one embodiment of principles described herein.

FIG. 2 is a diagram showing an illustrative three dimensional multilayer circuit (200) which includes a CMOS layer (205) and an overlying crossbar arrays (220, 225, 230, 235).

The CMOS layer (205) illustrated in FIG. 2 is "area distributed" rather than "peripherally distributed." Area distributed CMOS circuitry typically contacts the target circuitry over its bottom surface. The area distributed CMOS circuitry has several distinct advantages over contacting the target circuitry only around its periphery. In peripherally distributed CMOS circuitry, the density at which the CMOS circuitry can be packed around the target circuit can become a limiting factor in the circuit layout. Additionally, peripherally distributed CMOS circuitry can produce a combined circuit which occupies a large planar area, with long control and input/output lines. This leads to large values of line capacitance and resistance, which makes the write and read functions slow and energy intensive.

In contrast, area distributed CMOS circuitry typically underlies the target circuitry and can occupy as much room as the target circuit without increasing the required planar area of the combined circuit. Additionally, by connecting the CMOS circuitry to the overlying target circuit using vias, long connection traces are avoid. By avoiding long connection traces which are inherent in peripherally distributed configurations, the planar size and line capacitances of the circuit can be minimized. In particular, the nanowire length for area distributed interface is significantly reduced. This makes nanowire capacitance and resistance smaller, which makes write and read functions faster and lower energy, as well as reduces the number of devices connected to each nanowire thus decreasing possible leakage current.

According to one illustrative embodiment, the CMOS layer (205) contains a number of addressing cells which are connected to an array of vias which extend upward through the crossbar arrays (220, 225, 230, 235).

As described above, a crossbar array includes a set of upper crossbar wires (106, FIG. 1), a set of lower crossbar wires (108, FIG. 1) which intersect the upper crossbar wires (106, FIG. 1) at a non-zero angle, and programmable crosspoint devices interposed between the wires at the intersections (110, FIG. 1). In some illustrative embodiments, the crossbar wires (106, 108) do not extend across the entire array. Rather, the crossbar wires are segmented into shorter sections which are connected to the array vias which extend upward from the CMOS layer. The array of vias may be divided into two distinct sets of vias, a set of first vias (210) and a set of second vias (215). According to one illustrative embodiment, the first vias (210) are attached to lower crossbar segments and the second vias (215) are attached to upper crossbar segments.

As illustrated in FIG. 2, the crossbar array (205) is electrically connected to the underlying CMOS layer (205) by a first set of vias (210) and a second set of vias (215). According to one illustrative embodiment, first set of vias (210) connects to the lower crossbar segments in each crossbar array (220, 225, 230, 235) and a second set of vias (215) connects to the upper crossbar segments (250). In the upper most crossbar array (235), a first via connects to a lower crossbar segment (240) and a second via connects to an upper crossbar segment (250). A programmable crosspoint device (245) has been interposed between the upper and lower crossbar segments (250, 240).

Advantages of crossbar architectures which incorporate programmable crosspoint devices (245) include simplicity of construction, high density as a result of minimum feature sizes, stable memory for extended period of time, and other advantages.

According to one illustrative embodiment, each of the vias (210, 215) is connected to a crossbar segment in each of the crossbar array layers (220, 225, 230, 235). By orienting the crossbar segments differently in each layer, it has been discovered that multiple crossbar arrays can be uniquely addressed without the need for a greater number of CMOS cells or for additional vias.

FIG. 3A is a diagram of an illustrative multilayer circuit (200) with four crossbar arrays (220, 225, 230, 235). A CMOS layer (205) is at the base of the multilayer circuit (200). The CMOS layer (205) may include a number of access transistors which provide selective access to the vias (210, 215). According to one illustrative embodiment, the vias (210, 215) extend straight up through the crossbar arrays (220, 225, 230, 235).

As discussed above, the crossbar segments (335) attached to the vias are oriented differently in each layer. For example, in Layer 1 (220), the crossbar segment (335) attached to the first via A (340) may extend in a backward direction. The crossbar segment (335) attached to the first via A (340) in Layer 2 (225) may be rotated 90 degrees counter clockwise to the crossbar segment (335) in the first layer (220) and extend to the left. Similarly, the crossbar segment (335) attached to the first via (240) in the third layer (230) and fourth layer (235) may be oriented in different directions.

FIG. 3B shows a top view of each of the layers shown in FIG. 3A. The connectivity domain (300) of first via A (340) is defined by the surrounding second vias (310, 315, 320, 325) to which the first via A (340) is connected through intersecting crossbar segments. According to the illustration shown in FIG. 3B, the connectivity domain (300) encompasses the four immediately adjacent second vias (310, 315, 320, 325). Although the connectivity domain (300) only illustrates crossbar segments (335) and crosspoint devices (245) which are directly associated with the first via A (340), each of the second vias (310, 315, 320, 325) form an intersection with another first via. For clarity these additional crossbar segments and crosspoint devices are not illustrated.

In the bottom view of FIG. 3B a top view of crossbar array 1 (220) is shown. The crossbar segment (335) from first via A (340) extends rearward (upward) to intersect a crossbar segment (335) connected to second via A (310). A programmable crosspoint device (245) is interposed between the two intersecting crossbar segments and is addressed by selectively activating first via A (340) and second via A (310).

Moving upward in FIG. 3B, the next top view is of crossbar array 2 (225). A crossbar segment (335) attached to first via A (340) extends to the left and intersects a crossbar segment attached to second via B (315). Top views are also shown for crossbar array 3 (230) and crossbar array 4 (235). The geometry of the crossbar segments in these layers is similarly reoriented so that crosspoint devices (245) can be uniquely addressed in each crossbar array (220, 225, 230, 235). For example, crossbar array 4 (235), the first via A (340) and second via D (325) can be selectively activated to access a crosspoint device (345) in crossbar array 4 (235).

The connectivity domain (300), via patterns (340, 310, 315, 320, 325), and crossbar segments (335) shown in FIGS. 3A and 3B are only illustrative examples. A variety of other geometries could be used. For example, the connectivity domain could be significantly larger if the crossbar segments (335) were longer. Longer crossbar segments would intersect a greater number of perpendicular crossbar segments (335). This would allow more crosspoint devices (245) to be addressed using first via A (340) and consequently increase size of the connectivity domain (300) associated with first via A (340). Additionally, the vias could be attached at the center or other location along the crossbar segments (335) rather than the end of the crossbar segments.

The three dimensional multilayer circuit described above could be used in a variety of applications. For example, the multilayer circuit could be used in a very high density memory which replaces Dynamic Random Access Memory for computing applications; incorporated into a high density portable storage device that replaces flash memory and other removable storage devices for cell phones, cameras, net book and other portable applications; a very high density storage medium to replace magnetic hard disks and other forms of permanent or semi-permanent storage of digital data; and/or a very high density cache or other memory integrated on top of a computer processor chip to replace Static Random Access Memory.

According to one illustrative embodiment, the connections and crossbar segments each of the layers could be constructed with a single template. In the specification and appended claims, the term "template" is a master pattern which controls the creation of a geometric structure on a substrate. For example, a template may be a photolithography mask, a thermo nanoimprint mold, a photo nanoimprint mold, a soft lithography stamp, a micro contact printing stamp, or other suitable template for construction of structures on a substrate.

Figure 4A:
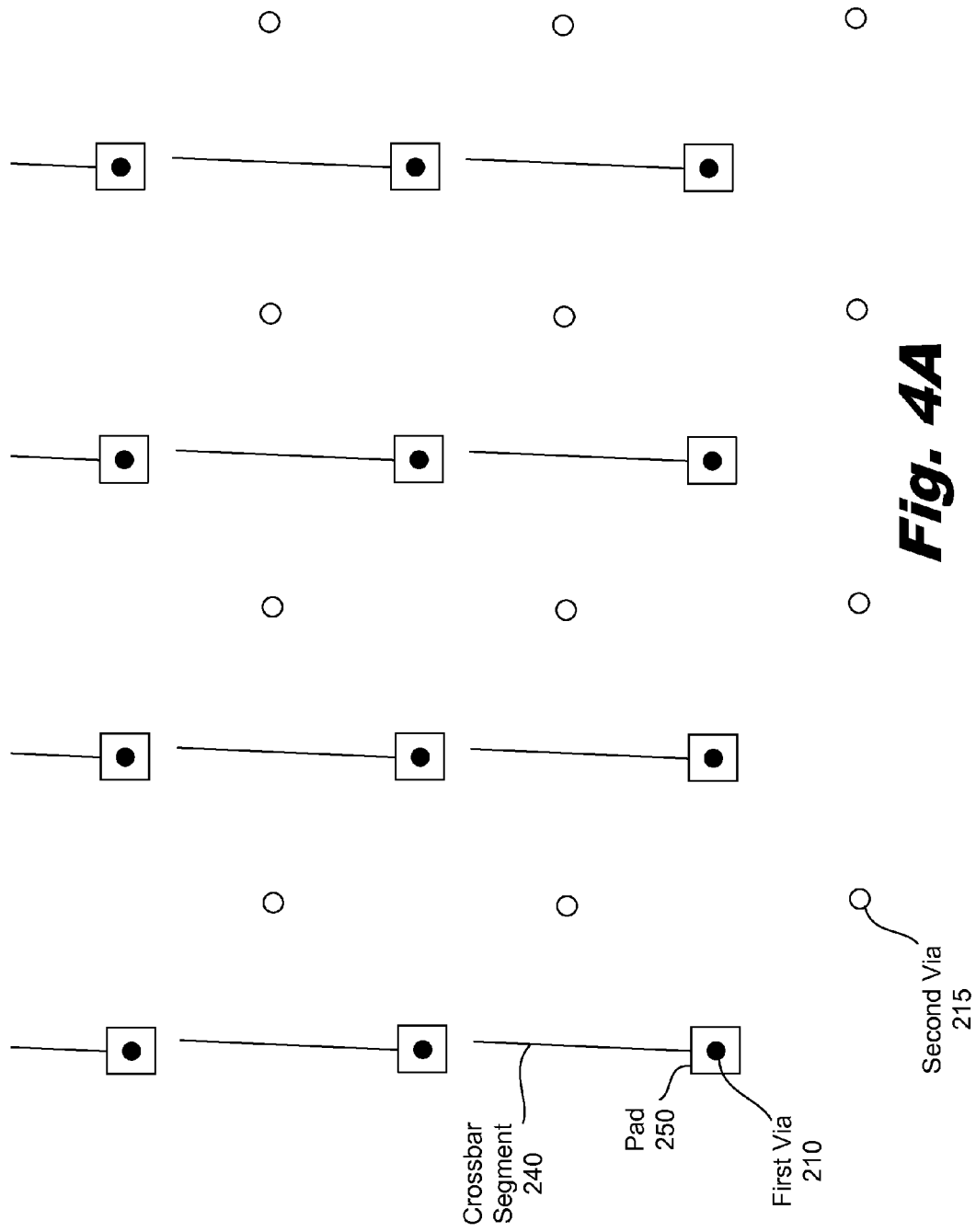
FIGS. 4A-4E are diagrams of one illustrative method for using a single mold/mask to construct a four layer vertically integrated circuit, according to one illustrative embodiment of principles described herein.

FIG. 4A shows structures formed using an illustrative template which connect to the vias (number) within the first array of vias (210) (illustrated in by solid circles) and extend crossbar segments (240) in a first direction. The template can then be lifted and reoriented in a second direction and aligned with the vias in the second array of vias (215) (illustrated by the open circles) as illustrated FIG. 4B. The resulting crossbar segments intersect the crossbar segments connected to the first array of vias. As discussed above, a programmable crosspoint device can be interposed between the crossbar segments at intersections. These crosspoint devices can be uniquely addressed by selectively activating the appropriate pair of vias using the underlying CMOS circuitry.

Figure 4B:
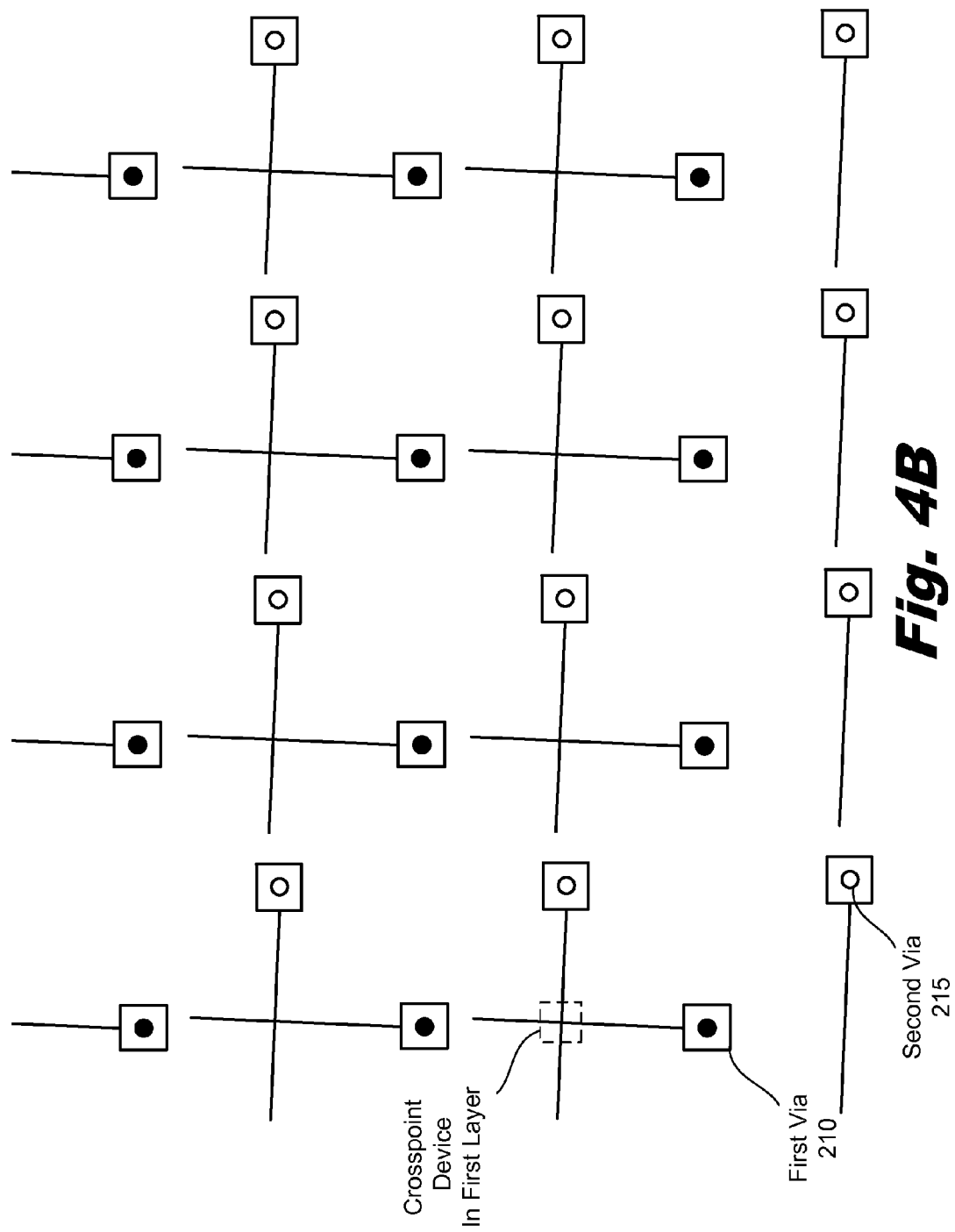
Figure 4C:
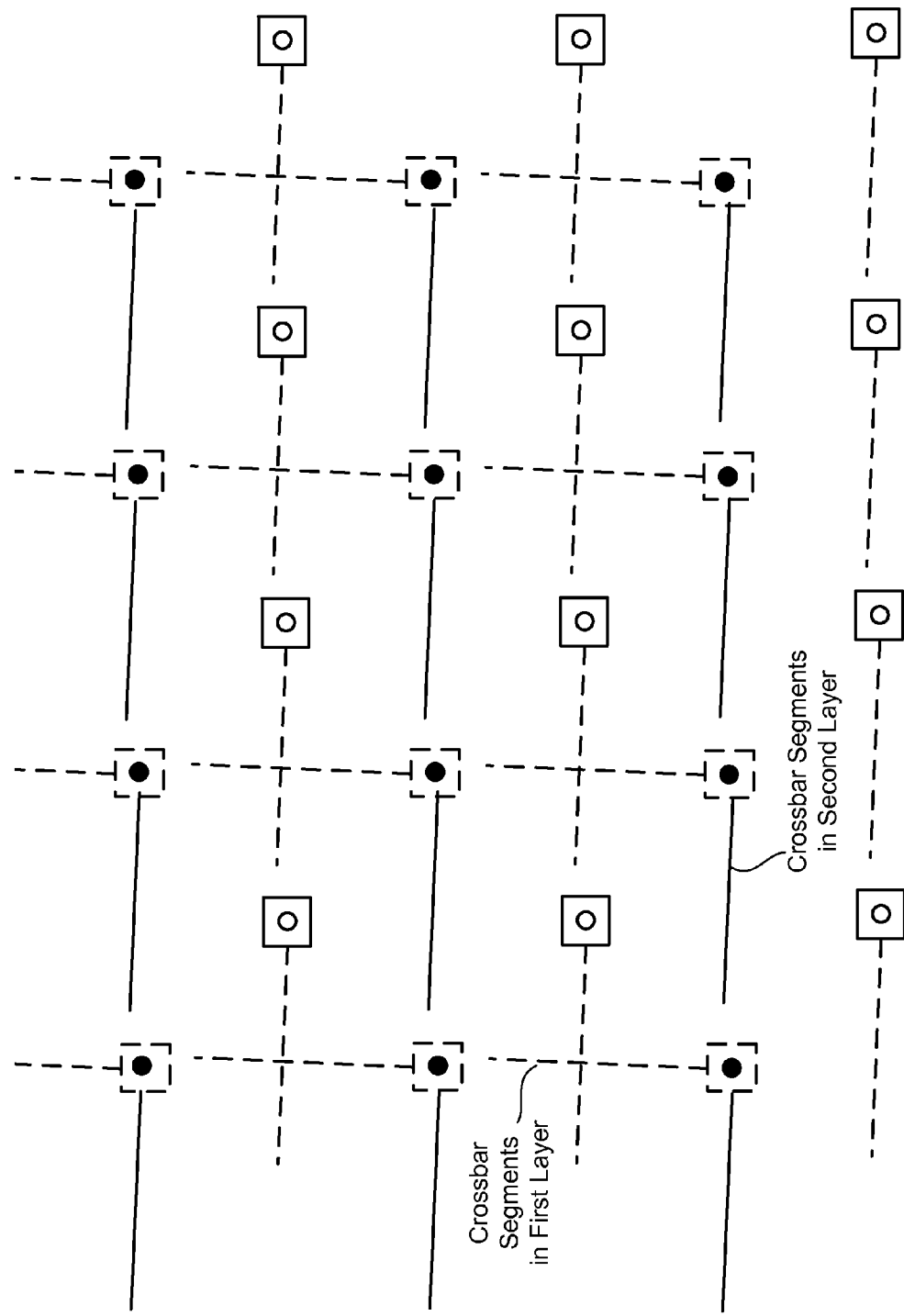
Figure 4D:
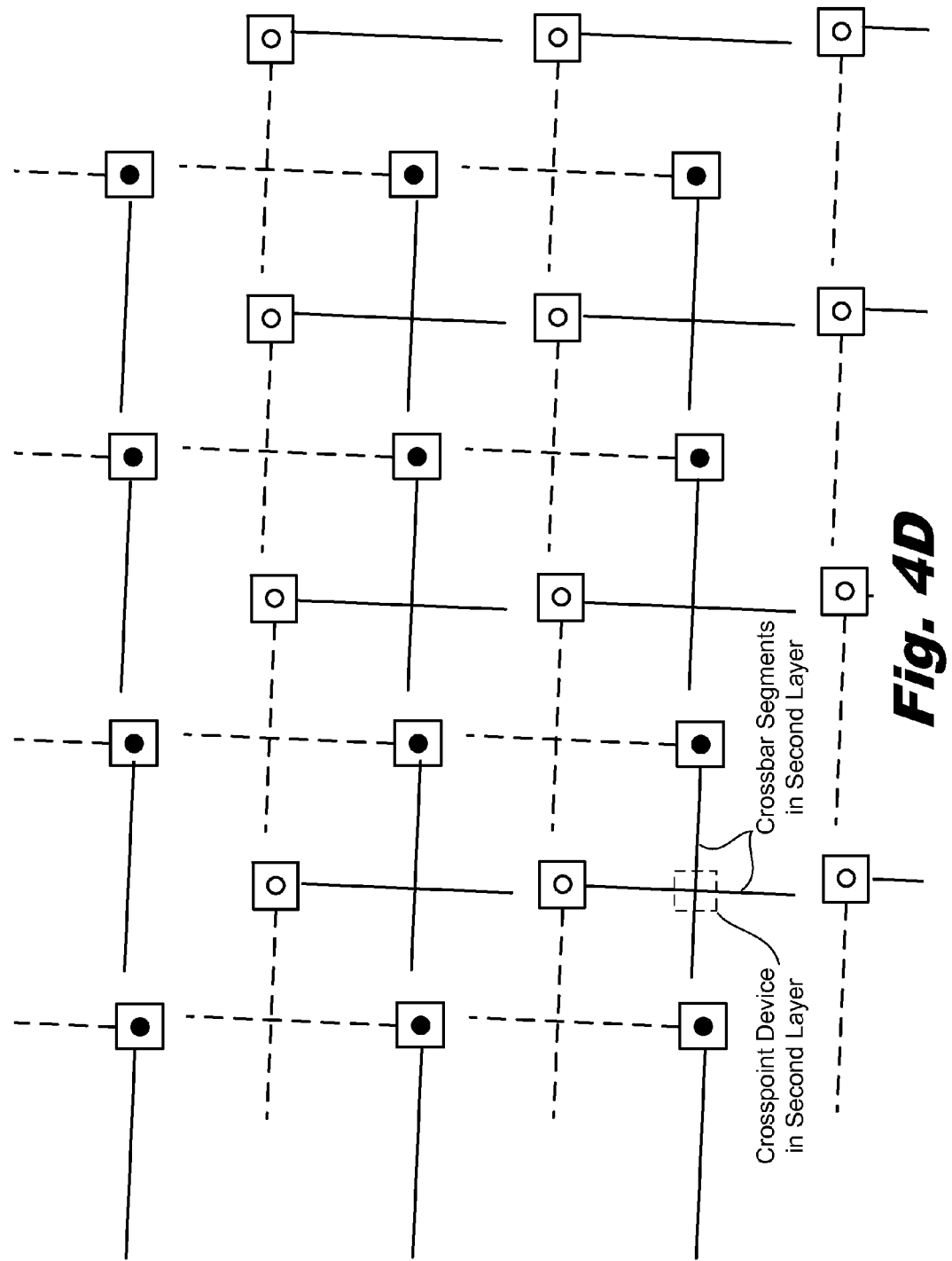

FIG. 4C shows construction of the multilayer circuit continuing to form a second crossbar array. For clarity, the crossbar segments shown in FIG. 4B which reside in the underlying first crossbar array have been shown as dashed lines. At this point, the process of rotating and aligning template is repeated. The template is aligned to the vias within the first via array and the crossbar segments are formed (shown by solid lines). The template can then be lifted and reoriented in a second direction and aligned with the vias in the second array of vias (illustrated by the open circles) as illustrated FIG. 4D. This process can be repeated to form the desired number of crossbar arrays.

Figure 4E:
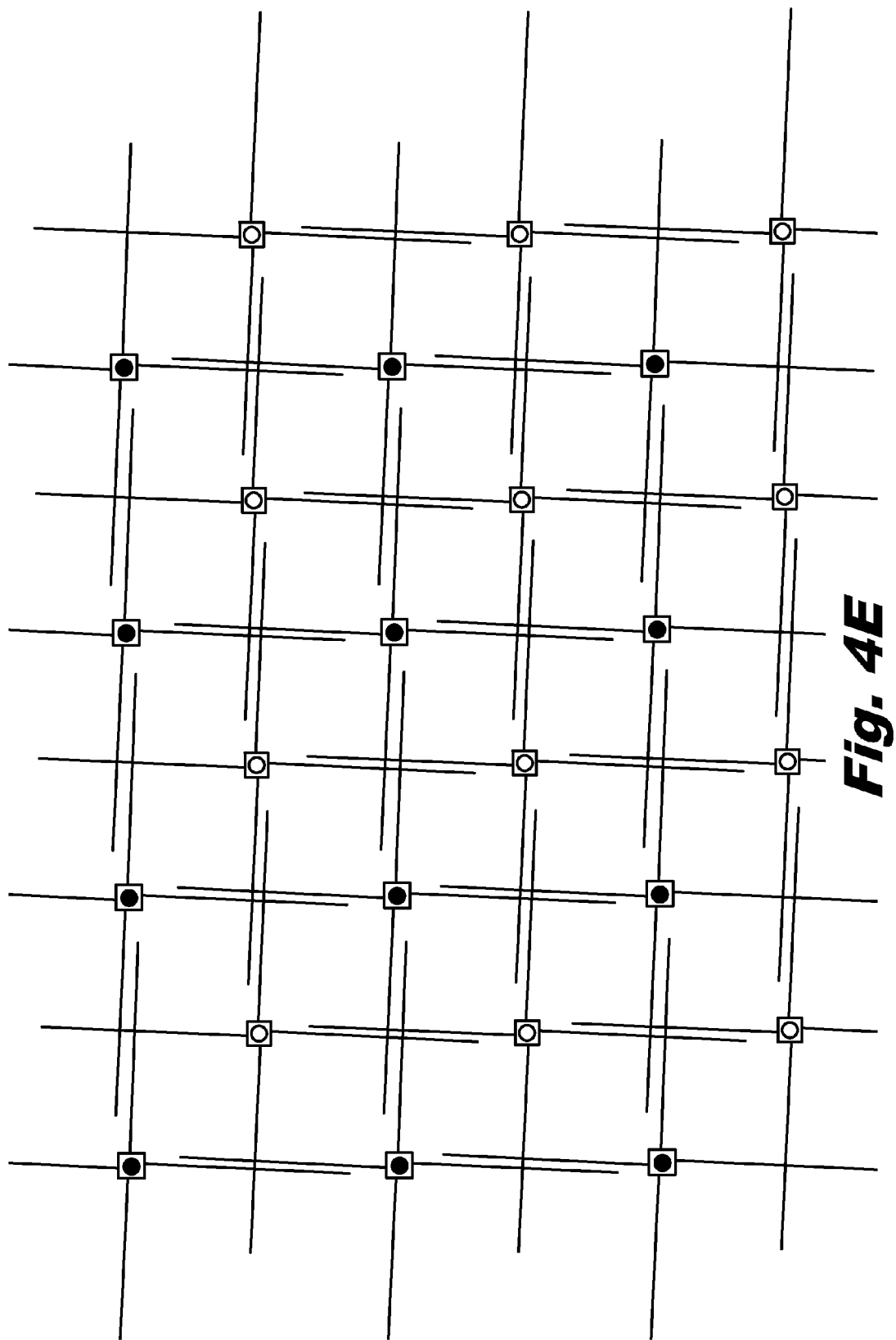

FIG. 4E shows a multilayer integrated circuit which illustrates connectivity between adjacent vias in all four layers. As discussed previously, the connectivity domain of each via extends to the four immediately adjacent vias of the opposite type. According to one illustrative embodiment, the crossbar segments may be angled with respect to the via arrays so that the crossbar segments can be extended past the adjacent vias without intersecting them.

Figure 5:
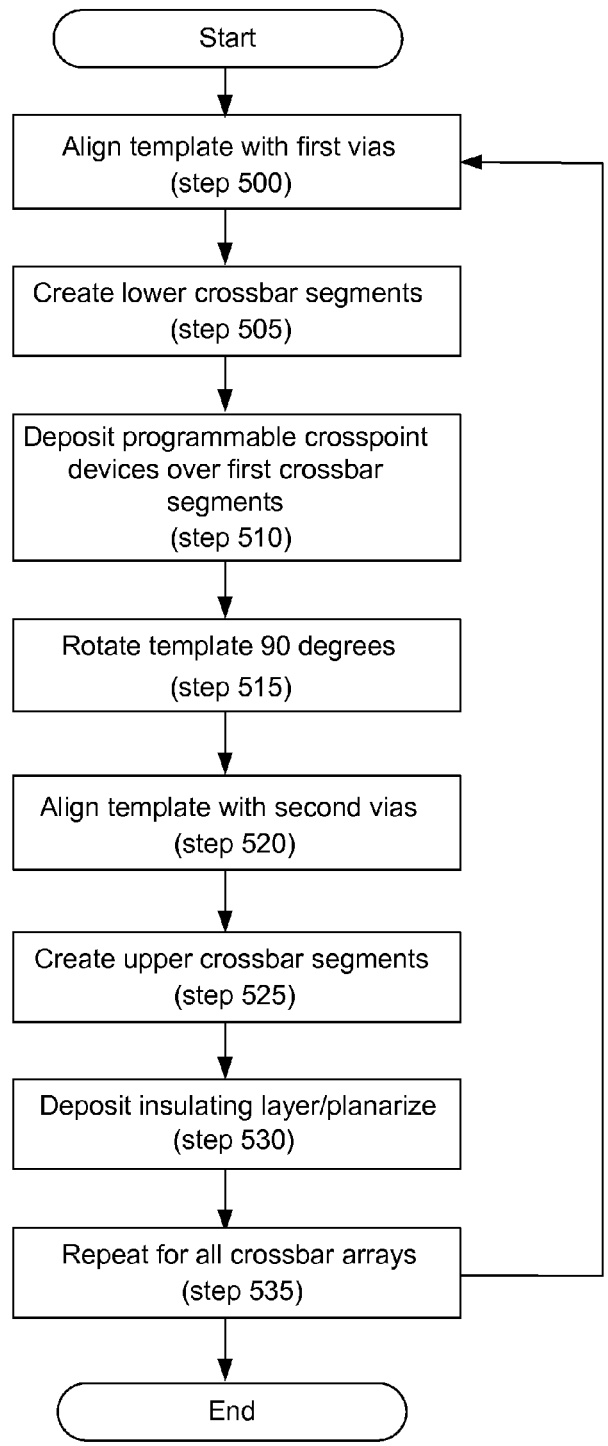
FIG. 5 is a flow chart showing one illustrative method for using a single mold/mask to construct a vertically integrated circuit, according to one illustrative embodiment of principles described herein.

FIG. 5 is a flow chart of one illustrative method for forming a three dimensional integrated circuit using a single template to create the crossbars within the crossbar arrays. According to one illustrative embodiment, the area distributed CMOS circuitry is first formed. The CMOS circuitry includes access cells which selectively address vias which pass upward from the CMOS circuitry and into the crossbar arrays. The template is aligned over a first set of vias (step 500). The lower crossbar segments are then formed using the template (step 505) as illustrated in FIG. 4A.

The template is removed and any number of intermediate steps can then be performed, including depositing programmable crosspoint devices over the first crossbar segments (step 510). According to one illustrative embodiment, the template is then rotated 90 degrees (step 515) and aligned with the second vias (step 520). In alternative embodiments, the template may be rotated in different ways and through a different angle. The upper crossbar segments are then created (step 525) such that the upper crossbar segments intersect the lower crossbar segments and sandwich the programmable crosspoint device between the upper and lower crossbar segments as shown in FIG. 1, FIG. 2, and FIG. 4B.

After the crossbar array is formed, it may be desirable to take additional steps to prepare the multilayer integrated circuit for the creation of the next crossbar array. By way of example and not limitation, an insulating layer may be deposited over the crossbar array. This insulating layer may be planarized in preparation for the deposition of the next lower crossbar segments (step 530). This process can be repeated using the same template for all the crossbar arrays (step 535).

In sum, the three dimensional multilayer circuit described above is a hybrid of CMOS circuitry and crossbar arrays which provides higher density in digital memories, dramatically improves the density of field programmable logic, and has significant applications in bio-inspired adaptive circuitry. For a limited number of layers, the connectivity domains can be shifted by utilizing symmetry operations without any intermediate wiring layers. This symmetry allows the crossbar segments within the crossbar arrays to be formed using a single template. The use of a single template to form the crossbar segments can significantly reduce the cost and complexity of forming the crossbar arrays.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A method for forming three dimensional multilayer circuit comprising:
   forming an area distributed CMOS layer configured to selectively address a set of first vias and a set of second vias;
   forming a crossbar array over the area distributed CMOS layer by:
      aligning a single template with the set of first vias;
      creating lower crossbar segments attached to the first set of vias using the single template;
      removing the single template;
      rotating the single template;
      aligning the single template with the set of second vias; and
      creating upper crossbar segments attached to the second set of vias using the single template,
      in which the upper crossbar segments, the lower crossbar segments and connections to the upper crossbar segments and lower crossbar segments in the crossbar array are formed using the single template.

2. The method of claim 1, further comprising forming programmable crosspoint devices at intersections between the lower crossbar segments and the upper crossbar segments.

3. The method of claim 2, in which forming programmable crosspoint devices further comprises depositing a memristive matrix with mobile dopants over the lower crossbar segment, the memristive matrix being doped with mobile ions.

4. The method of claim 3, further comprising creating the upper crossbar segments over the memristive matrix such that the memristive matrix is sandwiched between the lower crossbar segments and the upper crossbar segments.

5. The method of claim 2, in which the programmable crosspoint devices are memcapacitive devices.

6. The method of claim 1, in which the template is one of: a photolithography mask, a thermo nanoimprint mold, a photo nanoimprint mold, a soft lithography stamp, or a micro contact printing stamp.

7. The method of claim 1, in which the template is rotated approximately 90 degrees.

8. The method of claim 1, further comprising depositing an insulating layer over the upper crossbar segments.

9. The method of claim 8, further comprising planarizing the three dimensional integrated circuit before creating another overlying crossbar array.

10. The method of claim 1, further comprising repeating the method to create additional crossbar arrays.

11. The method of claim 1, in which the crossbar segments are skewed with respect to the first set of vias and the second set of vias such that the crossbar segments do not directly intersect adjacent vias.

12. The method of claim 1, in which the connectivity domain of a via from the first set of vias comprises four immediately adjacent vias from the second set of vias.

13. The method of claim 1, in which the three dimensional multi-layer integrated circuit comprises four crossbar arrays, the crossbar segments of the four crossbar arrays being formed with the template.

14. The method of claim 1, in which a number of vias and CMOS access cells connected to the vias in the three dimensional multilayer circuit does not increase as a number of crossbar arrays in the three dimensional multilayer circuit increase.

15. The method of claim 14, in which each programmable crosspoint device in the three dimensional multilayer circuit is configured to be uniquely addressed through a first via and a second via.

16. A method for forming a three dimensional integrated circuit comprising:
   forming an area distributed CMOS layer configured to selectively address a set of first vias and a set of second vias;
   forming a crossbar array over the area distributed CMOS layer by:
      aligning a template with the set of first vias;
      creating lower crossbar segments attached to the first set of vias;
      removing the template;
      forming programmable crosspoint devices over the lower crossbars segments;
      rotating the template 90 degrees;
      aligning the template with the set of second vias;
      creating upper crossbar segments attached to the second set of vias;
      depositing an insulating layer; and
      planarizing the insulating layer in preparation for the deposition of additional overlying layers;
   and repeating forming the crossbar array three additional times to form a total of four crossbar arrays over the area distributed CMOS layer, in which the area distributed CMOS layer is configured to selectively address the set of first vias and set of second vias, thereby uniquely accessing each programmable crosspoint device in the three dimensional integrated circuit.

17. A method for forming three dimensional multilayer circuit comprising:
   forming an area distributed CMOS layer configured to selectively address a set of first vias and a set of second vias;
   aligning a template with the set of first vias;
   creating lower crossbar segments attached to the first set of vias;
   removing the template;
   rotating the template;
   forming programmable crosspoint devices by depositing a memristive matrix doped with mobile ions over the lower crossbar segments;
   aligning the template with the set of second vias; and
   creating upper crossbar segments attached to the second set of vias such that the memristive matrix is sandwiched between the lower crossbar segments and the upper crossbar segments.

18. The method of claim 17, in which the crossbar segments are skewed with respect to the first set of vias and the second set of vias such that the crossbar segments do not directly intersect adjacent vias.

19. The method of claim 17, in which the connectivity domain of a via from the first set of vias comprises four immediately adjacent vias from the second set of vias.

20. A method for forming three dimensional multilayer circuit comprising:
   forming an area distributed CMOS layer configured to selectively address a set of first vias and a set of second vias;
   aligning a template with the set of first vias;
   creating lower crossbar segments attached to the first set of vias;

removing the template;
rotating the template;
aligning the template with the set of second vias; and
creating upper crossbar segments attached to the second set of vias;
in which the crossbar segments are skewed with respect to the first set of vias and the second set of vias such that the crossbar segments do not directly intersect adjacent vias.

* * * * *